United States Patent [19]
Hwang

[11] Patent Number: 5,578,401
[45] Date of Patent: Nov. 26, 1996

[54] PHOTOMASK FOR THE MEASUREMENT OF RESOLUTION OF EXPOSURE EQUIPMENT

[75] Inventor: Joon Hwang, Bubaleub, Rep. of Korea

[73] Assignee: Hyundai Electronics Industries Co., Ltd., Rep. of Korea

[21] Appl. No.: 415,608

[22] Filed: Apr. 3, 1995

[30]     Foreign Application Priority Data

Apr. 1, 1994 [KR]  Rep. of Korea .................... 1994-6952
Apr. 7, 1994 [KR]  Rep. of Korea .................... 1994-7284

[51] Int. Cl.$^6$ ........................................ G03F 9/00
[52] U.S. Cl. ............................ 430/5; 430/22; 430/30; 356/400; 356/401
[58] Field of Search .................................... 430/5, 22, 30; 356/400, 401, 374

[56]           References Cited

U.S. PATENT DOCUMENTS 4,881,257  11/1989  Nakagawa ............................. 430/5

Primary Examiner—S. Rosasco
Attorney, Agent, or Firm—Merchant, Gould, Smith, Edell, Welter & Schmidt

[57]           ABSTRACT

There are disclosed photomasks for the measurement of resolution of exposure equipment, comprising two superimposed patterns, each of which has a plurality of identical sub-patterns and is symmetric on its central axis, the two being aligned in such a way that the spaces between their opposite, corresponding sub-patterns become wider or narrower, in sequence, or comprising a plurality of concentric patterns which are interconnected by connecting films, the connecting films being formed in the space between the concentric patterns.

10 Claims, 3 Drawing Sheets

5,578,401

PHOTOMASK FOR THE MEASUREMENT OF RESOLUTION OF EXPOSURE EQUIPMENT

BACKGROUND OF THE INVENTION

1. Field of the invention

The present invention relates, in general, to photomasks for the measurement of resolution of exposure equipment and, more particularly, to provide accuracy and simplicity in measuring the resolution of exposure equipment.

2. Description of the Prior Art

Generally, photolithography is one of the most important processes for manufacturing semiconductor device circuits, by which a plurality of the same circuits can be formed on one wafer at same time. Indeed, the production yield of semiconductor device is virtually dependent on photolithography. Hence, the photomasking process is required to be precise. In Particular, the photomasks used should be accurately aligned in each process of photolithography for precision in the photomasking process. A photomask for measuring resolution of exposure equipment has usually been used to measure the resolution of a pattern formed, for example, in the photo process and the etch process, and the best focal state of the exposure equipment, in addition to measuring the resolution of the exposure equipment itself.

In order to better understand the background of the invention, a description a conventional photomask for measurement of resolution of exposure equipment is given below, with reference to FIGS. 1 and 2.

Referring to FIG. 1, there is shown a part of a wafer that is sectioned by scribe lines. Active regions on the wafer are defined by scribe lines 2 in which a pattern 3 is formed in order to measure resolution of exposure equipment.

Referring to FIG. 2, there is shown in detail the pattern for measuring resolution of exposure equipment. This resolution-measuring pattern consists of a plurality of groups in which several photosensitive film patterns 4 having identical line widths are separated by a regular space. The space between the photosensitive film patterns in each group is recognized by the numeral engraved in relief or intaglio beside the patterns, which value corresponds to the size of the group. Resolution of exposure equipment can be measured by obtaining a clear photosensitive film pattern 4 of a group with the least line width.

Since such a pattern for measuring resolution of exposure equipment is detected through a microscope with the naked eye, there is always a measurement error generated each time it is measured, which makes it very difficult to find the best state of the exposure equipment. Consequently, it is virtually impossible to accurately set the minimal limit of the resolution of exposure equipment with the conventional pattern.

In addition, the conventional pattern for measuring resolution of exposure equipment becomes finer with high integration of semiconductor device, and photolithography or etch processes cause the fine pattern to peel, generating defects in the semiconductor device.

SUMMARY OF THE INVENTION

Therefore, an object of the present invention is to overcome the problems encountered in the prior art and to provide a photomask for the measurement of resolution of exposure equipment, which measurement is more accurate and simple to obtain.

It is another object of the present invention to provide a photomask for the measurement of resolution of exposure equipment, which prevents peeling of resolution-measuring photosensitive film patterns.

In accordance with one aspect of the present invention, there is provided a photomask for the measurement of resolution of exposure equipment, comprising two superimposed patterns, each of which has a plurality of identical subpatterns and is symmetric on its central axis, the two patterns being aligned in such a way that the spaces between their opposite, corresponding sub-patterns may become wider or narrower, in sequence.

In accordance with another aspect of the present invention, there is provided a photomask for the measurement of resolution of exposure equipment, comprising a plurality of concentric patterns which are interconnected by connecting films, the connecting films being formed in the space between the concentric patterns.

BRIEF DESCRIPTION OF THE DRAWINGS

The above objects and other advantages of the present invention will become more apparent by describing the preferred embodiment of the present invention in detail with reference to the attached drawings, in which.

DETAILED DESCRIPTION OF THE PREFERRED EMBODIMENTS

Figure 1:
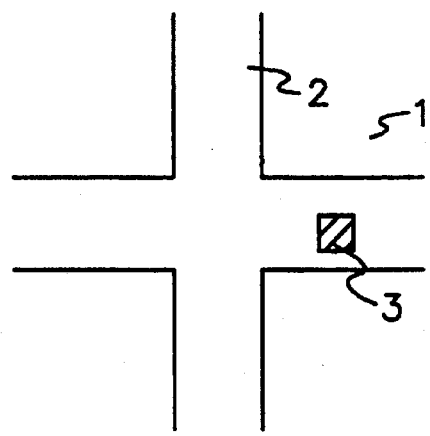
FIG. 1 is a top view of a wafer showing a pattern for measuring resolution of exposure equipment which is formed in a scribe line.
Figure 2:
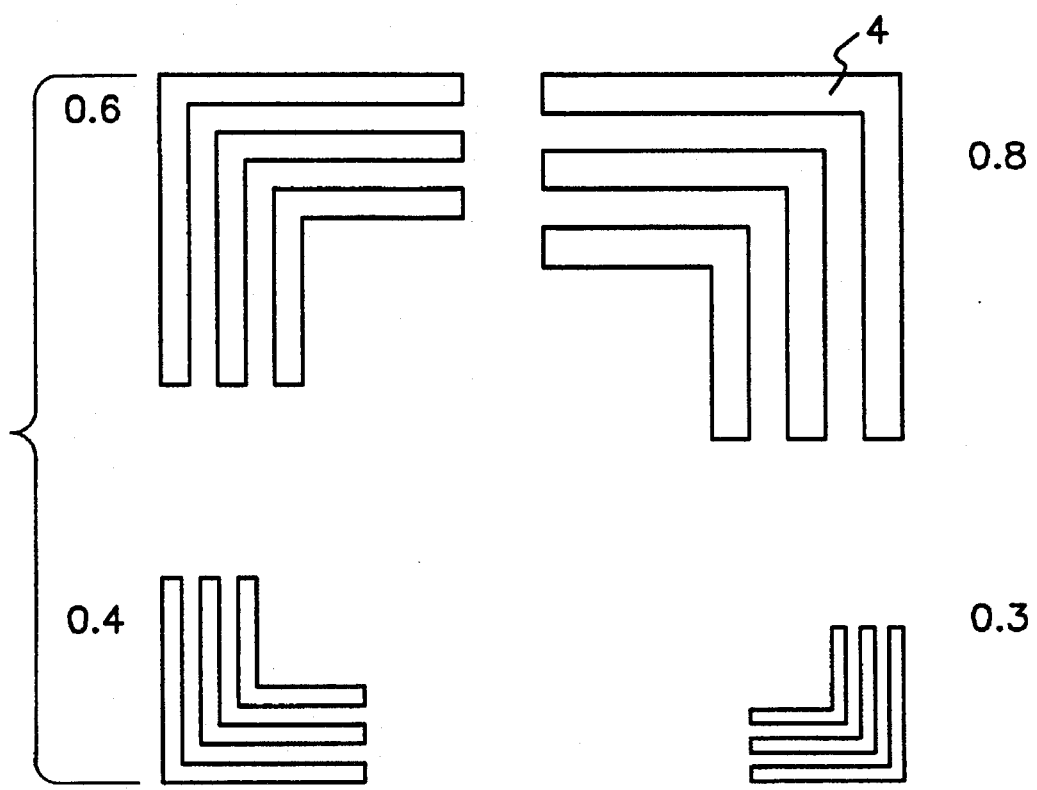
FIG. 2 is a detail view of the pattern of FIG. 1.

The application of the preferred embodiments of the present invention is best understood with reference to the accompanying drawings, wherein like reference numerals are used for like and corresponding parts.

Figure 3:
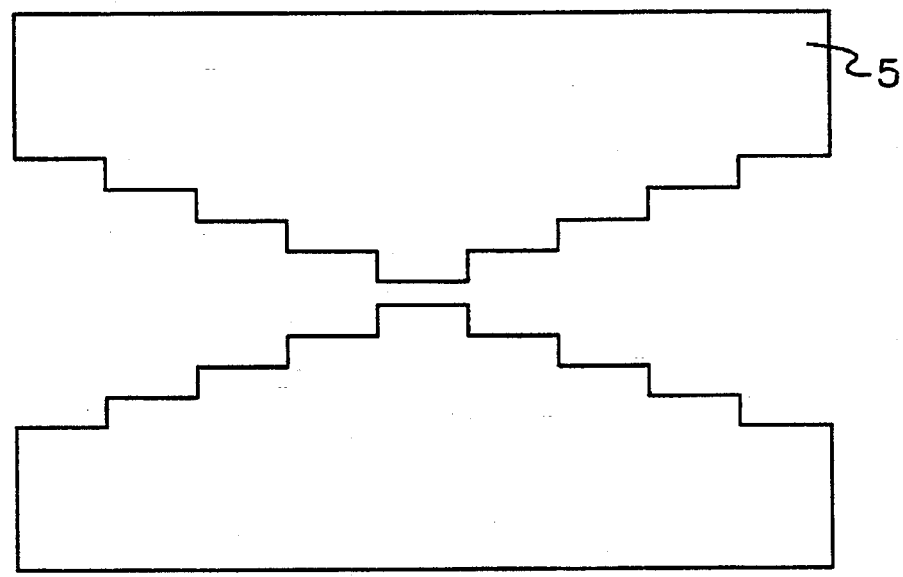
FIG. 3 is a top view showing patterns for measuring resolution of exposure equipment, according to one embodiment of the present invention.

Referring initially to FIG. 3, there are two chrome film patterns formed on a photomask, that are superimposed with respect to each other. Each of the chrome film patterns has a plurality of steps ascending to and descending from its central step and is symmetrical on its central vertical axis. The two superimposed chrome patterns 5 are used to form a photosensitive film pattern on a wafer, which pattern is directly used for measuring resolution of exposure equipment. As shown in FIG. 3, the photomask of the invention comprises two superimposed, symmetrical chrome film patterns which are structured in such a way that the space between corresponding steps of the two patterns become wider or narrower, in sequence.

According to an embodiment of the present invention, the space between two opposing steps is larger by 0.1 µm than the space between their adjacent inner steps, with the width of the steps being constant. For example, if the central step of the one chrome pattern is 0.3 µm apart from its counterpart (the central step of the other chrome pattern) the next step is 0.4 µm apart from its counterpart, the third step is 0.5

μm apart and so on, while all of the steps are identical in width, for example in a range of 5 to 15 μm.

Figure 4:
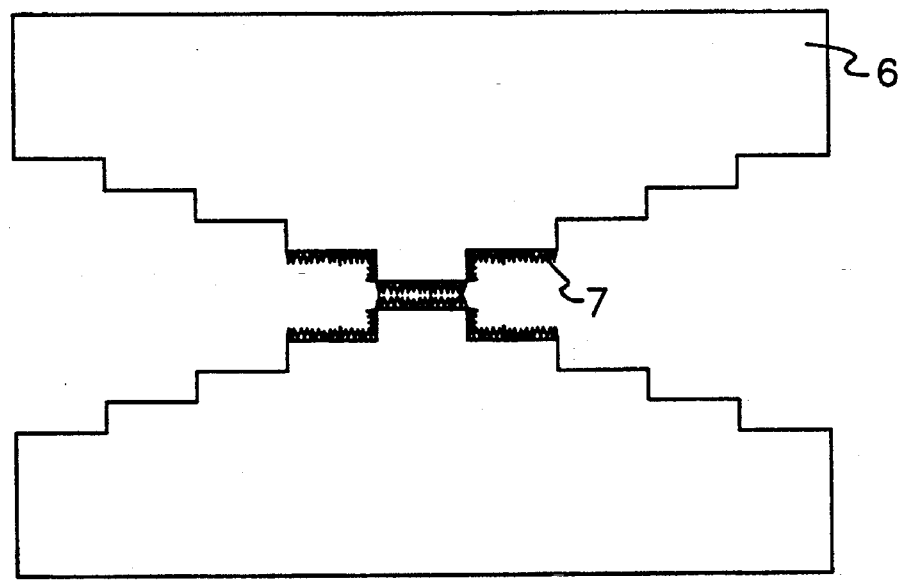
FIG. 4 is a top view showing photosensitive film patterns which are formed by use of the resolution-measuring patterns of FIG. 3.

With reference to FIG. 4, there are shown photosensitive film patterns 6 that are formed in a scribe line on a semiconductor substrate by use of the photomask of FIG. 3. When the photosensitive film patterns are formed, residual photosensitive films usually appear in a region outside the limit of the resolution of exposure equipment For example, if the residual photosensitive film 7, as shown in FIG. 4, is left around the central step and its adjacent step when the photosensitive film pattern 6 is formed by use of the photomask illustrated in FIG. 3, it is readily determined that the resolution is 0.5 μm, because the photosensitive film pattern 6 is not exactly defined at the regions of 0.3 μm and 0.4 μm. From this illustration, it is apparent that the resolution of exposure equipment can be measured rapidly and accurately, according to the first embodiment of the present invention.

Figure 5:
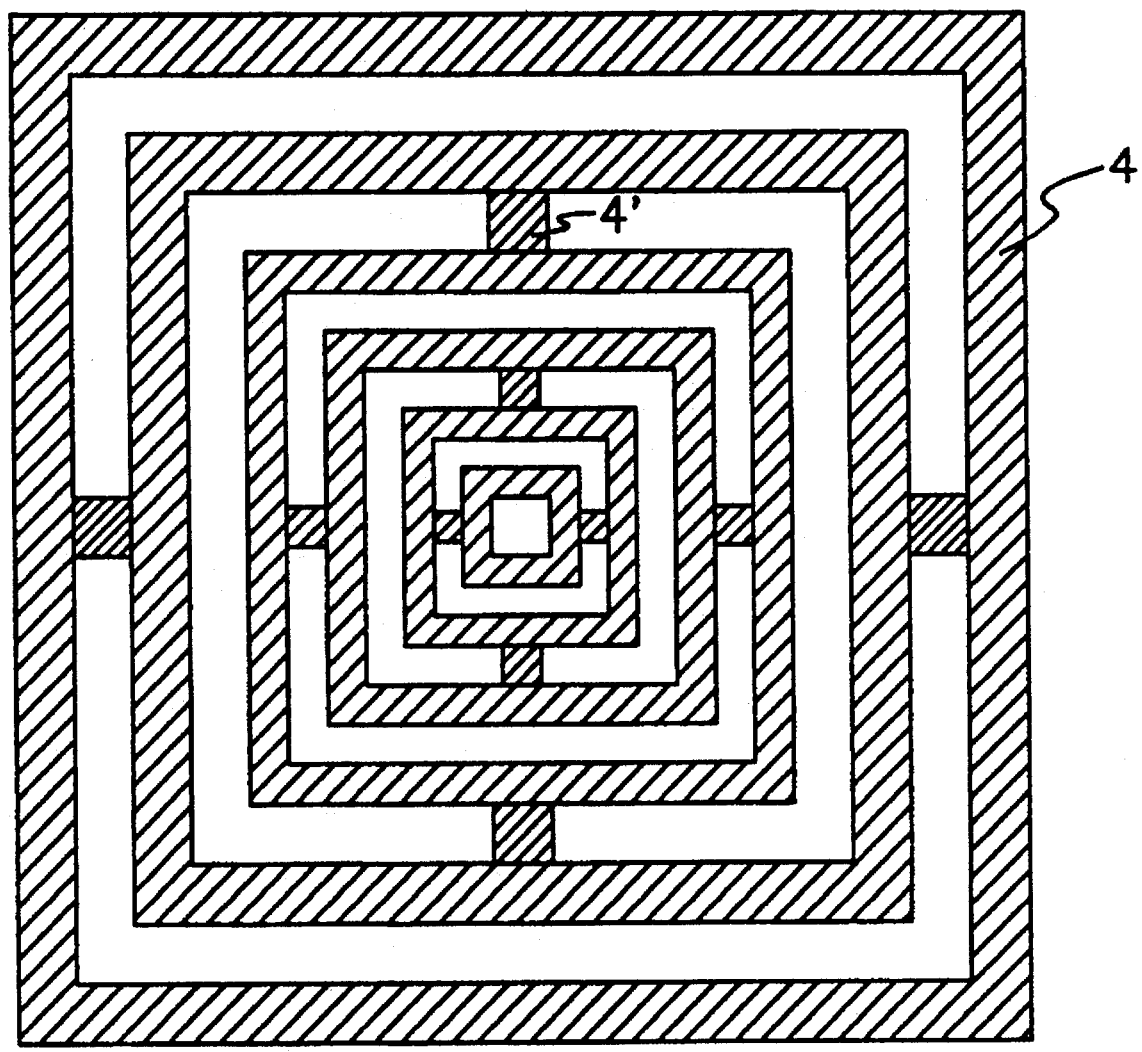
FIG. 5 is a top view showing patterns for measuring resolution of exposure equipment, according to another embodiment of the present invention.

Turning now to FIG. 5, there is a photomask for measuring resolution of exposure equipment according a second embodiment of the present invention. As shown in this Figure, the photomask has a plurality of chrome film patterns 4 which are concentric with one another and interconnected by square connecting films 4'. In the photomask, two or more adjacent concentric chrome film patterns are of the same line width. For example, both the innermost chrome pattern and its adjacent one are of 0.3 μm width, the third and the fourth chrome patterns are 0.6 μm wide, and the fifth and the sixth are 0.8 μm wide. At present it is preferred that the photomask for measuring resolution of exposure equipment is in a size ranging from 20 to 50 μm. In accordance with the present invention, the chrome film pattern of the photomask may have the form of a square, a circle, a "¬" type or a "[" type.

The role of the connecting films 4' is to form their corresponding patterns of photosensitive film on a semiconductor substrate when the photomask for measuring resolution of exposure equipment is used to form the resolution-measuring photosensitive film patterns interconnected thereby, thus preventing peeling of the respective photosensitive patterns. That is to say, peeling of the fine photosensitive film patterns formed on a wafer can be prevented by interconnecting the chrome film patterns of the photomask with the connecting films.

As described above, the present invention results in an improvement in production yield and achievement of accurate circuits being accomplished in fabricating semiconductor devices.

Other features, advantages and embodiments of the invention disclosed herein will be readily apparent to those of ordinary skill in the art after reading the foregoing disclosures. In this regard, while specific embodiments of the invention have been described in considerable detail, variations and modifications of these embodiments can be effected without departing from the spirit and scope of the invention as described and claimed.

What is claimed is:

1. A photomask for the measurement of resolution of exposure equipment, comprising; superimposed patterns, having a common central axis, each of the patterns having a plurality of identical and corresponding sub-patterns and being symmetric on the central axis, the patterns being aligned so that spaces separating pairs of the corresponding sub-patterns become wider or narrower for pairs increasingly spaced from the central axis in sequence, wherein resolution measurement may be made using the spacings between the pairs of sub-patterns.

2. A photomask in accordance with claim 1, wherein the sub-patterns are of the same width.

3. A photomask in accordance with claim 2, wherein the width of the sub-patterns is in a range of 5 to 15 μm.

4. A photomask for the measurement of resolution exposure equipment, comprising a plurality of concentric patterns which are interconnected by connecting films formed in spaces between the concentric patterns.

5. A photomask in accordance with claim 4, wherein the concentric patterns have a form of a square, a circle, a "¬" shape or a "[" shape.

6. A photomask in accordance with claim 4, wherein two adjacent concentric patterns are of the same line width.

7. A photomask for use in measuring resolution of exposure equipment, comprising:

a transparent substrate; and first and second patterns, each of said first and second patterns having a stepped region symmetrical about a common axis, said first and second patterns being disposed on said substrate with opposing stepped regions, each stepped region comprising a plurality of adjacent sub-patterns, each first sub-pattern which is a part of said first pattern corresponding to a second sub-pattern which is a part of said second pattern, said corresponding first and second sub-patterns being separated by a pair separation, the pair separation increasing for pairs of corresponding first and second sub-patterns spaced further from the common axis in sequence.

8. A photomask for the measurement of resolution of exposure equipment, comprising:

a transparent substrate;

a plurality of concentric patterns disposed on said substrate for measuring resolution; and connecting films disposed on said substrate between said concentric patterns, for connecting adjacent concentric patterns and preventing peeling of said concentric patterns from the substrate.

9. A photomask in accordance with claim 8, wherein said concentric patterns are formed of adjacent pairs of concentric sub-patterns, sub-patterns in a pair having identical widths.

10. A photomask in accordance with claim 9, further comprising a first spacing distance between a first adjacent pair of concentric sub-patterns and a second spacing distance between a second adjacent pair of concentric sub-patterns, wherein said first spacing distance is greater than said second spacing distance.

* * * * *